United States Patent [19]

Matsumura et al.

[11] Patent Number: 4,867,223

[45] Date of Patent: Sep. 19, 1989

[54] METHOD AND APPARATUS FOR FORMING A METAL SHEET HAVING A CONCAVE-CONVEX PROFILE BY CHEMICAL VAPOR DEPOSITION

[75] Inventors: Syuusuke Matsumura, Yao; Hajime Kojima, Hirakata; Takahiro Miyano, Neyagawa, all of Japan

[73] Assignee: Matsushita Electric Works, Ltd., Osaka, Japan

[21] Appl. No.: 267,588

[22] Filed: Nov. 7, 1988

[30] Foreign Application Priority Data

Nov. 13, 1987 [JP] Japan ................... 62-287623

[51] Int. Cl.[4] ................................. B22D 23/00
[52] U.S. Cl. ..................... 164/46; 118/723; 427/53.1; 427/251; 427/253; 427/255.3
[58] Field of Search ................. 164/46; 118/723; 427/53.1, 251, 253, 255.3

[56] References Cited

U.S. PATENT DOCUMENTS

| | | |
|---|---|---|
| 2,685,121 | 8/1954 | Davis et al. |
| 2,701,901 | 2/1955 | Pawlyk. |
| 3,176,356 | 4/1965 | Jenkin ................... 164/46 |
| 3,608,615 | 9/1971 | Conlon ................... 164/46 |

FOREIGN PATENT DOCUMENTS

| | | |
|---|---|---|
| 36-19556 | 10/1961 | Japan. |
| 42-27388 | 12/1967 | Japan. |
| 59-197560 | 11/1984 | Japan. |
| 60-55123 | 12/1985 | Japan. |
| 61-235059 | 10/1986 | Japan ................... 164/46 |

Primary Examiner—Richard K. Seidel
Attorney, Agent, or Firm—Armstrong, Nikaido, Marmelstein, Kubovcik & Murray

[57] ABSTRACT

A method and apparatus for forming a metallic sheet having a concave-convex profile by chemical vapor deposition utilizes a die having a profiled surface defined by a number of spaced protrusions. The method comprises covering at least a portion of the profiled surface with a mask of transparent material in such a way that the mask comes into a closely adjacent relation to the top faces of the protrusions, feeding at a reaction gas of a metallic compound to a restricted space defined between the mask and the profiled surface, radiating a light beam through the transparent mask onto the profiled surface in order to decompose the reaction gas and deposit on the profiled surface a metallic layer, and removing the resulting deposited metallic layer from the profiled surface to obtain a metallic sheet having a concave-convex profile corresponding to the profiled surface of the die. The apparatus comprises a reaction chamber within which the die and the mask are mounted for making the metallic sheet by chemical vapor deposition and includes a take-up roll driven to rotate to peel the metallic sheet off the die and wind the same thereon.

5 Claims, 4 Drawing Sheets

METHOD AND APPARATUS FOR FORMING A METAL SHEET HAVING A CONCAVE-CONVEX PROFILE BY CHEMICAL VAPOR DEPOSITION

BACKGROUND OF THE INVENTION

1. Field of the Invention

The present invention is directed to a method and an apparatus for forming a metallic sheet having a concave-convex profile by chemical vapor deposition (CVD), and more particularly to such method and apparatus for forming a metallic sheet such as a shearing foil of a dry shaver which has a number of hair introducing holes with a raised edge, or an ornamental metallic sheet with a concave-convex surface pattern.

2. Discussion of the Prior Art

A typical example of such metallic sheet having a concave-convex profile is an outer shearing foil formed with a number of hair introducing holes each surrounded by a raised rim or edge which is in shearing engagement with a complementary inner cutter. In the past, techniques for making such outer shearing foil with such hair introducing hole have been proposed as disclosed in the following prior art references.

(1) Japanese Patent Publication No. 60-55123 on Dec. 3, 1985;
(2) Japanese Patent Publication No. 36-19556 on Oct. 17, 1961; and
(3) Japanese Patent Publication No. 42-27388 on Dec. 25, 1967.

The prior art (1) is directed to a press-forming technique in which a blank metal sheet is press-formed into a suitable configuration between a die and a complementary ram followed by being trimmed or cut to obtain the profiled metal sheet having the hair introducing holes with raised edges from a blank metal sheet. This technique requires considerable care for eliminating undue deformation developed in the sheet during the press-forming process to assure a correct formation of a desired profile including the configuration and the size of the holes and the spacing between the adjacent holes, thus posing difficulty and inconvenience.

The prior art (2) is directed to an etching technique in which a blank metal sheet has its two opposite surfaces etched at particular portions while being masked in the respective surfaces. Therefore, this technique requires duplicate masking operations and etching operations or steps with respect to the opposite surfaces of the blank metal sheet with the corresponding difficulty in controlling an etching solution, which may also pose a problem.

The prior art (3) is directed to an electrodeposition technique in which an outer shearing foil is formed as being deposited on a substrate through repeated electrodeposition with the use of an electrical insulative material on the substrate. Also in this technique, there are required cumbersome masking and pre-electrodeposition steps on the substrate prior to forming the profiled metal deposition layer by the electrodeposition, which is found to be disadvantageous, in addition to the difficulty in controlling an electrodeposition solution.

Although not directed to the formation of the outer shearing foil for the dry shaver, Japanese Patent Publication No. 59-197560 issued on Nov. 9, 1984 teaches the chemical vapor deposition process for depositing a metal layer on a substrate with the use of a laser light. This process may be applicable to obtaining the separate metal sheet off the substrate, but it is found practically impossible with this process to obtain a profiled metal sheet having a number of holes with raised edges or other projections.

SUMMARY OF THE INVENTION

The present invention eliminates the above problems and provides a unique method and apparatus for forming by chemical vapor deposition a metallic sheet having a concave-convex profile such as characterized by a number of holes with raised edges or other projections. The method in accordance with the present invention utilizes a die having a profiled surface defined by a number of spaced protrusions and comprises covering at least a portion of the profiled surface with a mask of transparent material such that the mask comes into a closely adjacent relation to the top faces of the protrusions, feeding a reaction gas including at least a metallic compound to a restricted space defined between the mask and the profiled surface, and radiating a light beam through the mask onto the profiled surface in order to decompose the reaction gas and deposit on the profiled surface a resulting deposited metallic layer. Thereafter, the metal layer is removed from the profiled surface of the die to obtain the metallic sheet having a concave-convex profile corresponding to the profiled surface of the die.

Accordingly, it is a primary object of the present invention to provide a method of forming a metal sheet having a concave-convex profile in exact duplication of the profiled surface of the die in a simple manner without requiring a blank metal sheet and without resorting to complicated press-forming or chemical procedures.

Preferably, the die is provided in the form of a rotatable drum having the profiled surface therearound and the mask is formed to extend over a circumferential portion of the drum in slidable contact therewith. The drum is driven to rotate in one direction to continuously deposit the metallic layer on the portion of the profiled surface being covered by the mask while the deposited metallic layer is peeled off from the profiled surface, thereby presenting a continuous metallic sheet having the corresponding profiled surface configuration.

It is therefore another object of the present invention to provide a method of forming the profiled metal sheet in a continuous manner or into a hoop-like configuration form.

The resulting metallic sheet having profiled configuration may be subsequently subjected to a suitable surface treatment such as for providing a hardened layer on or in the profiled surface of the metallic sheet, enabling the profiled metallic sheet to be used in a wide variety of application fields.

The method of the present invention is particularly advantageous for manufacturing a shearing foil having a number of hair introducing holes each surrounded by a raised edge for use in combination of an inner cutter of a dry shaver. In making the shearing foil, it is preferred to contact the mask on the top faces of the protrusions on the profiled surface of the die so that the metallic layer is deposited on the profiled surface except for the top faces of the protrusions, thus leaving at the top faces of the protrusions corresponding holes each surrounded by the raised edge formed by the deposition on the side wall of the protrusion. Thus, it is readily possible to form such shearing foil with a number of hair introducing holes each surrounded by the raised edge only in a single deposition process. Further, the shearing foil is treated to provide a hardened layer in or on the profiled surface which is in use in shearing contact with a complementary inner cutter.

It is therefore a further object of the present invention to provide a method of forming a shearing foil having a number of hair introducing holes and further finished with a hardened layer on or in the surface for shearing contact with a complementary inner cutter.

The apparatus in accordance with the present invention comprises a reaction chamber accommodating therein the profiled die in the form of the rotating drum and supplied with the reaction gas of metallic compound. The transparent mask is placed over a portion of the profiled surface of the die to define therebetween a restricted space into which the reaction gas is supplied. A light source is included to radiate the light beam through the mask to decompose the reaction gas in the restricted space and consequently deposit a metallic layer on the profiled surface. The drum is driven to rotate in one direction while the mask is held stationary so as to continuously deposit the metallic layer on the portion of the profiled surface being covered by the mask as the drum rotates. Also included in the apparatus is a take-up roll which is driven to rotate for winding thereabout thus obtained metal sheet while peeling it off the profiled surface of the rotating drum.

It is therefore a still further object of the present invention to provide an apparatus for forming the metallic sheet having a concave-convex profile which is capable of obtaining a continuous metallic sheet as being wounded on a take-up roll.

These and still other objects and advantages will become more apparent from the following description of the embodiment of the present invention when taken in conjunction with the attached drawings.

DESCRIPTION OF THE PREFERRED EMBODIMENT

Figure 1:
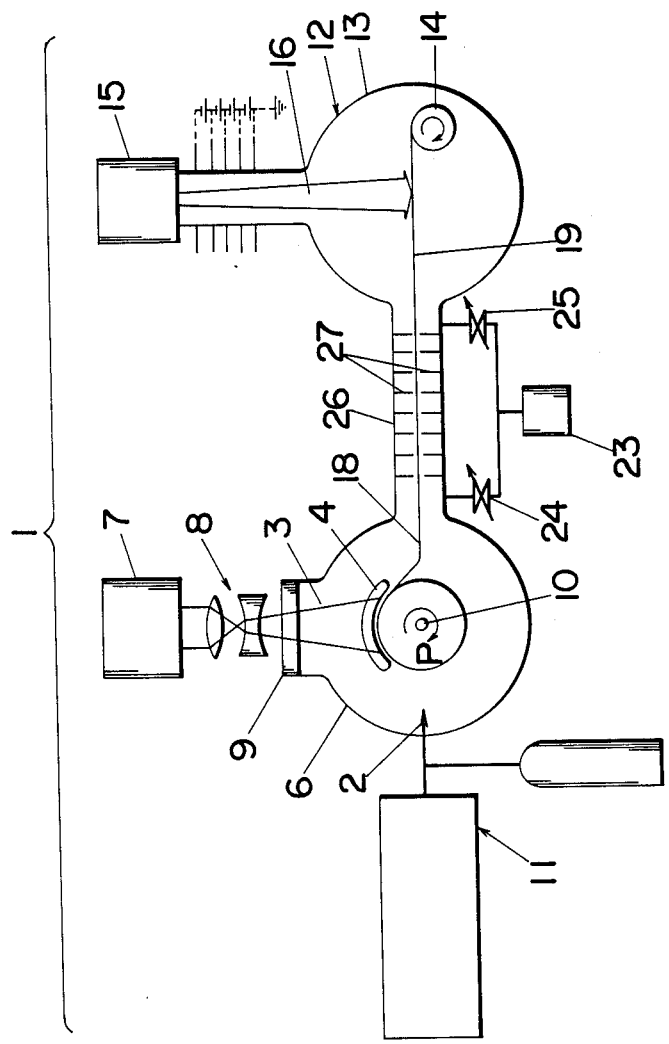
FIG. 1 is a schematic view of an apparatus for forming a metallic sheet with a concave-convex profile in accordance with a preferred embodiment of the present invention.
Figure 8:
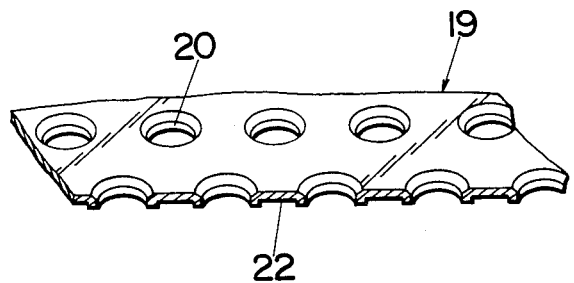
FIG. 8 is a perspective view of the shearing foil.

The present invention will be explained in detail with reference to FIG. 1 which illustrates a CVD (chemical vapor deposition) apparatus 1 for forming a shearing foil having a number of hair introducing holes 20 as shown in FIG. 8, as one example of a metal sheet having a concave-convex profile. Before explaining the embodiment of the present invention, it is to be understood that the invention is not limited in its application to the manufacture of the shearing foil for the dry shaver set forth in the following description and should be understood to be applicable to other metallic sheets having a profiled surface. The CVD apparatus 1 comprises a reaction chamber or cell 6 supplied with a reaction gas 2 including at least a metallic compound or organometallic complex and a light source 7 emitting a light beam 3 such as laser, ultraviolet, or infrared beam which activates the reaction gas for deposition thereof. The reaction gas 2, for example, titanium tetrachloride ($TiCl_3$) or aluminum chloride ($AlCl_3$) volatiled and carried by a hydrogen or oxygen, is supplied into the cell 6 from a gas generator 11. The cell 6 is evacuated to one (1) to several tens (10) Torr by means of a vacuum pump 23 and a pair of valves 24 and 25. Mounted within the cell 6 is a die 5 in the form of a rotating drum onto the portion of which the light beam 3 is radiated from the light source 7 through a lens combination 8 composed of convergent and divergent lenses and through a window 9 at the upper end of the cell 6. These lenses are selected to suitably adjust the radiation area on the die 5 and may be replaced by any other adjusting means.

Figure 2:
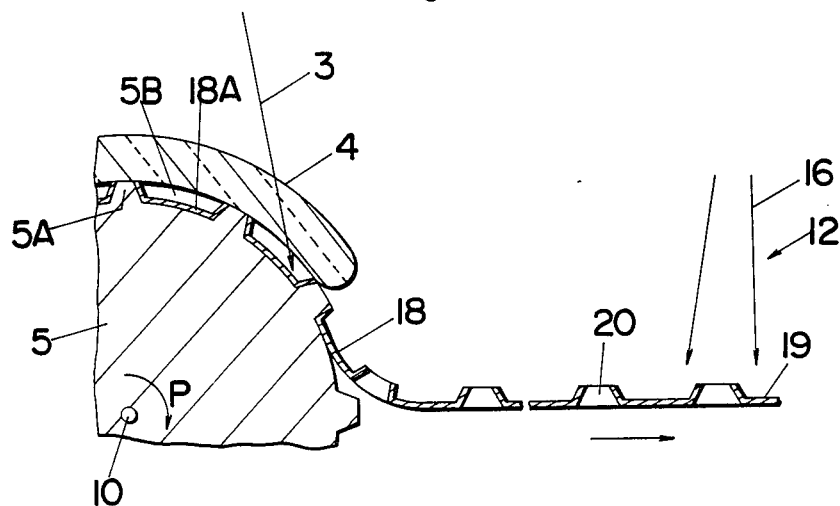
FIG. 2 is a partial view showing the metallic sheet together with a drum and a mask utilized in the above apparatus.

The die or drum 5 is formed on its periphery with a number of protrusions 5A which are distributed in a certain pattern over the surface of the drum 5 in a corresponding pattern to the hair introducing holes 20 in the shearing foil intended to be formed. An arcuately shaped mask 4 of a material transparent to the light beam 3 is disposed around the portion of the drum 5 in slidable contact relation to a generally flattened but somewhat curved top faces of the protrusions 5 in such a way as to leave between the mask 4 and the die surface a restricted space 5B. As shown in FIGS. 1 and 2, the drum 5 is driven to rotate in a direction P about an axis 10 crossed with the direction of the light beam 3 while the mask 4 is held stationary in sliding contact with the top faces of the protrusions 5A. As the drum 5 rotates, the reaction gas 2 is entrapped in the restricted space 5B between the mask 4 and the portion of the drum 5 where it is subjected to the light beam 3 through the mask 4 to leave on the surface of the drum 5 except the top faces of the protrusions 5 a deposition layer 18A of a metal or metallic compound by the chemical reaction induced by the light beam 3 or by the heat effect thereof. For example, the deposition layer of titan or aluminum is deposited when titanium tetrachloride ($TiCl_4$) or aluminum chloride ($AlCl_3$) is utilized as being carried by a hydrogen gas; the deposition layer of titanium nitride (TiN) or titanium oxide ($TiO_2$) is deposited when the mixture of titanium tetrachloride and nitrogen ($TiCl_4 + N_2$) or the mixture of titanium tetrachloride and oxygen ($TiCl_4 + O_2$) is utilized as being carried by oxygen gas; and the deposition layer of aluminum nitride (AlN) is deposited when the mixture of aluminum chloride and nitrogen ($AlCl_3 + N_2$) is utilized as being carried by carbon dioxide gas.

Figure 3:
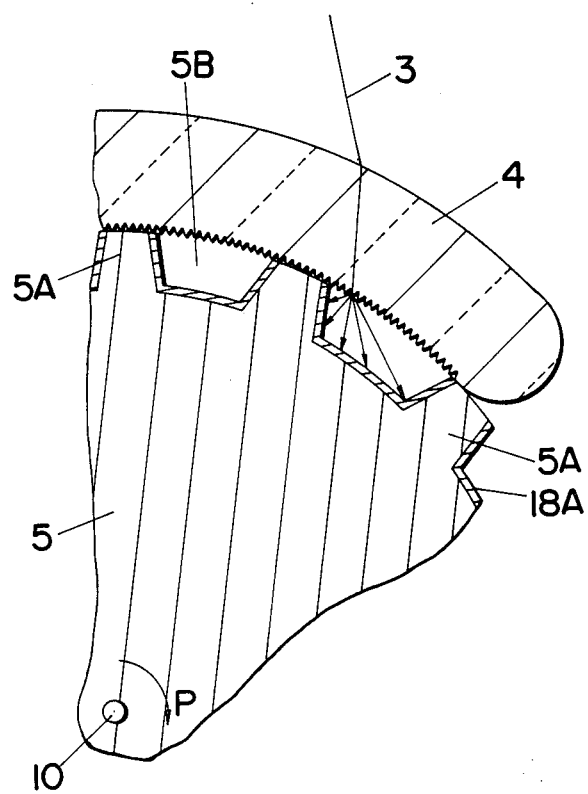
FIG. 3 is an enlarged view illustrating a portion of FIG. 2.

As shown in FIG. 3, the transparent mask 4, which is made from quartz glass, is preferred to have a minute serration 4A in the undersurface opposing the die 5 in order to effectively diffuse the light beam 3, serving to evenly form the metallic deposition layer 18A of substantially uniform thickness.

The metallic deposition layer 18A, which has a thickness of about $50\mu$ and is formed with a number of the hair introducing holes 20 at the protrusions 5A, is then peeled off the drum 5 in a continuous form to provide a continuous metallic hoop sheet 18 as the drum 5 rotates, which sheet is subsequently wound on a take-up roll 14.

Thus obtained metallic sheet 18 has accordingly the surface profile of the shearing foil which is characterized to have a number of hair-introducing holes 20 each formed at the portion corresponding to each of the protrusions 5A on the drum 5 and each surrounded by a raised rim or edge formed on the side wall of the protrusion 5A, as best shown in FIG. 2. To ensure smooth peeling off of the deposition layer 18A, a thin sheet (not shown) of a material easily separable from the deposition layer 18A may be placed over the surface of the drum 5. For this purpose, the sheet is formed with a number of apertures corresponding to the top faces of the protrusions 5A. Further, the sheet may be peeled off the drum 5 as supporting the deposition layer 18A in the form of a continuous sheet so as to be subsequently removed therefrom after effecting a suitable surface treatment to the deposited layer or sheet. The reaction gas 2 introduced in the cell 6 is exhausted by the vacuum pump 23 and through the operation of the valves 24 and 25 to adjust the vacuum within the cell 6 to a suitable level.

Figure 4:
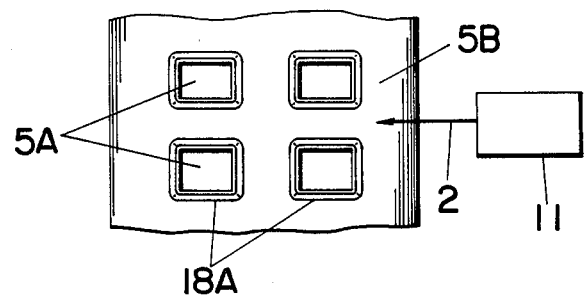
FIG. 4 is a top view of the metal sheet deposited on the die in accordance with a modification of the above embodiment.
Figure 5:
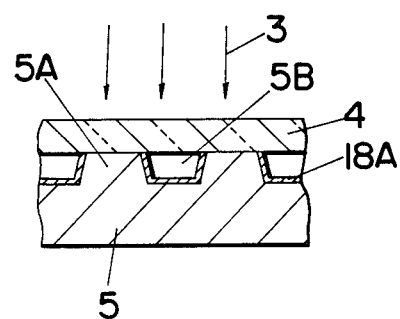
FIG. 5 is a sectional view of the die covered by a mask utilized in modification of FIG. 4.

Although the die is provided in the form of the rotating drum 5 in the above embodiment, it is equally possible to use a die 5 in the form of a flat plate having the like protrusions 5A on its surface, as shown in FIGS. 4 and 5. In this modification, the reaction gas 2 is introduced in the restricted space 5B between the die 5 and the mask 4 from the gas generator 11 and is likewise deposited in cooperation with the mask 4 to form a corresponding metallic deposition layer 18A to be subsequently peeled off as the like shearing foil having the hair introducing holes each surrounded by a raised edge.

Figure 6:
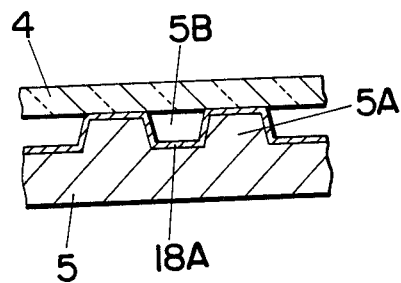
FIG. 6 is a sectional view of another modification of the above embodiment.

FIG. 6 shows another modification of the above embodiment which is identical to the previous modification of FIG. 5 except that the mask 4 is spaced by a slight distance from the top faces of the protrusions 5A to extend the restricted spaced 5B thereover, thus permitting the deposition also on the top faces of the protrusions 5A. The resulting metallic sheet peeled off the die 5 is thus formed with a number of concavo-convex projections.

Figure 7:
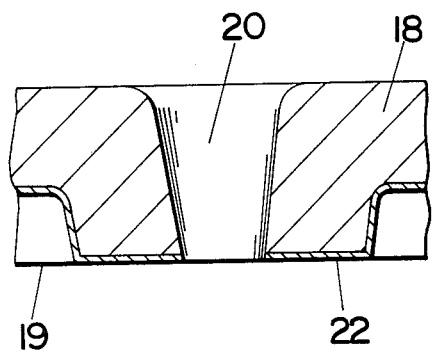
FIG. 7 is an enlarged sectional view of the metallic sheet formed as a shearing foil with hair introducing holes for use in a dry shaver.

The metallic sheet 18 obtained in a manner described in the above embodiment is subjected to a suitable surface treatment by a surface treatment device 12 prior to being wound about the take-up roller 14. The surface treatment device 12, which is for effecting ion irradiation of nitrogen or carbon to the surface of the metallic sheet 18, comprises a secondary cell 13 communicated with the cell 6 by way of an elongated channel 26 and an ion radiating device 15 producing an ion beam 16 to the metallic sheet 18. The cell 13 within which the take-up roll 14 is mounted is evacuated to a higher vacuum level, i.e., $10^{-3}$ Torr by the vacuum pump 23 and valve 25. To this end, a number of baffles 27 are provided within the channel 26 between the respective inlet ports of the valve 24 and 25 for differentiating the vacuum level of the cell 13 from the cell 6. With this surface treatment, the metallic sheet can have in its outer surface a hardened layer 22 by the formation of titanium nitride (TiN) or titanium carbide (TiC), presenting a surface treated metallic sheet 19 finished with the hardened layer 22. The metallic sheet 19 thus obtained is cut to a suitable dimension so that it is ready without any further processing or treatment for use as the shearing foil having a number of hair introducing holes 20 each surrounded by the raised edge, as shown in FIGS. 7 and 8. Also noted from these figures, the hardened layer 22 is formed in the surface including the lower end of each raised edge which comes into shearing contact with an inner cutter (not shown).

The surface treatment is not limited to the above ion radiation and may include a vacuum deposition or sputtering technique to provide a hardened layer on the surface of the metallic sheet, or may include a plating technique. Further, another ion radiating may be added in the apparatus of FIG. 1 for applying the surface treatment also to the undersurface of the metallic sheet 19.

What is claimed is:

1. A method of forming a metallic sheet having a concave-convex profile by chemical vapor deposition which comprises:
   providing a die having a profiled surface defined by a number of spaced protrusions;
   covering at least a portion of said profiled surface with a mask of transparent material such that said mask comes into a closely adjacent relation to the top faces of said protrusions;
   feeding a reaction gas including at least a metallic compound to a restricted space defined between said mask and said profiled surface of said die;
   radiating a light beam through said transparent mask onto said profiled surface in order to decompose said reaction gas and deposit on said profiled surface a metallic layer; and
   removing said layer of metal from said profiled surface to obtain the resulting metal sheet having a concave-convex profile corresponding to the profiled surface of said die.

2. A method as set forth in claim 1, wherein
   said die is provided in the form of a rotatable drum having therearound said profiled surface and said mask is arcuated to extend over a portion of the said profiled surface in slidable contact therewith;
   said method comprising rotating said drum in one direction to continuously deposit said metallic layer on the portion of said profiled surface covered by said mask while peeling thus deposited metallic layer off the profiled surface to obtain a continuous metallic sheet having said concave-convex profile.

3. A method as set forth in claim 1, wherein
   said method further comprising effecting surface treatment on or in the outer surface of said metallic sheet.

4. A method of forming a metallic sheet having a concave-convex profile by chemical vapor deposition which comprises:
   providing a die having a profiled surface defined by a number of spaced protrusions;
   covering at least a portion of said profiled surface with a mask of transparent material such that said mask comes into a closely adjacent relation to the top faces of said protrusions;
   feeding a reaction gas including at least a metallic compound to a restricted space defined between said mask and said profiled surface of said die;
   radiating a light beam through said transparent mask onto said profiled surface in order to decompose said reaction gas and deposit on said profiled surface a metallic layer except said top face of each protrusion; and
   removing said deposited metallic layer from said profiled surface to obtain the resulting metallic sheet having a number of spaced holes corresponding to said protrusions on said die; and forming a hardened sub-layer on or in the surface of said metallic sheet opposite to the inner peripheries of said holes to make the metallic sheet adapted in use as a shearing foil having said holes each surrounded by a raised edge which is formed as being deposited on the side wall of each protrusion.

5. An apparatus for continuously forming a metallic sheet having a concave-convex profile by chemical vapor deposition which comprises:

a reaction chamber provided with a reaction gas including at least a metallic compound;

a die in the form of a rotating drum having therearound a profiled surface which is defined by a number of protrusions;

a mask of transparent material placed over a portion of said profiled surface in a closely adjacent relation to the top faces of said protrusions;

a light source radiating a light beam through said mask onto said profiled surface to decompose said reaction gas and deposit a metallic layer on said profiled surface;

means for driving said drum in one direction to continuously deposit said metallic layer on the portion of said profiled surface covered by said mask; and means for peeling said deposited metallic layer off said profiled surface of said rotating drum to obtain a continuous metallic sheet having a concave-convex profile corresponding to the profiled surface of said die and for winding said continuous sheet of metal on a take-up roll.

* * * * *